(12) United States Patent
Nishizawa

(10) Patent No.: US 6,893,973 B2
(45) Date of Patent: May 17, 2005

(54) METHOD OF ETCHING SILICON NITRIDE FILM AND METHOD OF PRODUCING SEMICONDUCTOR DEVICE

(75) Inventor: Atsushi Nishizawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 225 days.

(21) Appl. No.: 10/405,479

(22) Filed: Apr. 3, 2003

(65) Prior Publication Data

US 2003/0203631 A1 Oct. 30, 2003

Related U.S. Application Data

(62) Division of application No. 09/739,891, filed on Dec. 20, 2000, now Pat. No. 6,613,686.

(30) Foreign Application Priority Data

Dec. 21, 1999  (JP) .......................................... 11-362810

(51) Int. Cl.⁷ ............................................. H01L 21/302
(52) U.S. Cl. ...................... 438/710; 714/723; 714/724; 714/725; 714/743; 714/744
(58) Field of Search ................................ 438/710, 714, 438/723, 724, 725, 743, 744

(56) References Cited

U.S. PATENT DOCUMENTS

| | | | |
|---|---|---|---|
| 5,643,824 A | | 7/1997 | Chien et al. |
| 5,970,373 A | | 10/1999 | Allen |
| 6,083,822 A | * | 7/2000 | Lee .............................. 438/624 |
| 6,180,512 B1 | | 1/2001 | Dai |
| 6,180,518 B1 | * | 1/2001 | Layadi et al. ................ 438/639 |
| 6,239,455 B1 | * | 5/2001 | Becker et al. .............. 257/209 |
| 6,294,102 B1 | | 9/2001 | Bennett et al. |
| 6,297,162 B1 | * | 10/2001 | Jang et al. ................... 438/706 |
| 6,297,163 B1 | * | 10/2001 | Zhu et al. .................... 438/707 |
| 6,462,395 B1 | * | 10/2002 | Fukuda et al. .............. 257/520 |
| 6,600,183 B1 | * | 7/2003 | Visokay et al. ............. 257/295 |

FOREIGN PATENT DOCUMENTS

| | | |
|---|---|---|
| JP | 60-115231 | 6/1985 |
| JP | 60-115232 | 6/1985 |
| JP | 5-90221 | 4/1993 |
| JP | 10-303187 | 11/1998 |
| JP | 11186224 | 7/1999 |
| JP | 11-220021 | 8/1999 |
| JP | 11-307516 | 11/1999 |

* cited by examiner

Primary Examiner—Nadine G. Norton
Assistant Examiner—Binh X. Tran
(74) Attorney, Agent, or Firm—Young & Thompson

(57) ABSTRACT

Provided is a method of etching a silicon nitride film, which comprises subjecting the silicon nitride film located on copper to dry etching using a mixture of fluorocarbon gas and an inert gas as the reaction gas, the fluorocarbon gas containing $CF_4$ and $CHF_3$ supplied at flow rates in a ratio of 3:7 to 0:1 or contains $CF_4$ and $CH_2F_2$ supplied at flow rates in a ratio of 2.5:1 to 0:1, thereby suppressing the formation of copper fluoride.

6 Claims, 4 Drawing Sheets

0.30 μm

Cupper Fluoride

Results of SIMS Analysis

METHOD OF ETCHING SILICON NITRIDE FILM AND METHOD OF PRODUCING SEMICONDUCTOR DEVICE

This application is a divisional Ser. No. of 09/739,891 filed on Dec. 20, 2000 now U.S. Pat. No. 6,613,686.

BACKGROUND OF THE INVENTION

1. Field of the Invention

The present invention relates to a method of etching a silicon nitride film. The present invention also relates to a method of producing a semiconductor device and, more particularly, to a method that is effective in forming multi-layer interconnects in a semiconductor device having copper interconnects.

2. Description of the Related Art

In recent years, in LSI devices that operate at increasingly higher speeds and are packaged at increasingly higher density, not only transistors but also conductive lines (interconnects) are required to be finer and formed at a higher density.

While Al has been used predominantly as the metallic material to form interconnects, there has been a problem of electro-migration (EM) wherein a temperature rise due to the increasing current density through the interconnects and the heat generated from the entire device mobilizes metal atoms in the interconnects layer, thus eventually generating voids in the portion of migration, leading to interconnects breakage. There is also such a problem that a block of grains referred to as "hillock" is formed in a portion where metal atoms are accumulated, which causes a stress in an insulation layer formed on the wiring, eventually causing cracks.

In order to solve these problems, it has been proposed to use alloys made by adding a trace of Si or Cu to Al. However, sufficient effect of this method cannot be achieved when the interconnects become finer and the packaging density increases, and the use of copper interconnects having higher reliability is being studied.

When copper interconnects are used, a process called the damascene method is employed in which copper is deposited in grooves or holes formed in an insulation film, then the surface is smoothed thereby inlaying the copper in the grooves or holes.

The process of forming the copper interconnects by the damascene method will be described below with reference to accompanying drawings. FIG. 1 is a sectional view showing the process of the damascene method of inlaying copper in via holes formed in an inter-layer insulation film. As shown in FIG. 1(a), a silicon nitride film is formed as an etching stopper film 5 on an under-layer copper interconnects 4 that is formed by embedding via a barrier film 3 in an inter-layer insulation film 2 provided on a semiconductor substrate 1, then an inter-layer insulation film 6 is formed thereon from silicon oxide or the like. The silicon nitride film also performs a function of preventing the copper interconnects from being oxidized when forming the silicon oxide film thereon. FIG. 1(a) shows the state of a resist 7 being patterned for the purpose of forming grooves or via holes in the inter-layer insulation film 6 where copper is to be inlaid. Then as shown in FIG. 1(b), the inter-layer insulation film 6 is etched using the resist pattern as the mask. The etching may be done under any dry etching conditions that allow sufficiently high etch selectivity over the silicon nitride film that serves as the stopper film. Then as shown in FIG. 1(c), in order to facilitate contact between the inlaid copper and the under-layer copper interconnects 4, the stopper film 5 exposed at the bottom of the via hole 8 is removed by dry etching using a fluorocarbon gas. This is followed by inlaying of copper in the via holes 8 thus formed, after forming a barrier film 9 to a thickness of about 10 to 100 nm as shown in FIG. 1(d) in order to prevent copper from diffusing into the silicon oxide film. For the material used to form the barrier film 3 and the barrier film 9, nitrides of metals having high melting points such as TiN, WN and TaN may be preferably used or the nitrides and the metals having high melting points may be used in a laminated structure. Then a thin copper film that serves as a seed is formed by CVD process or electroless plating process, and a thick copper film 10 is formed by electroplating (FIG. 1(e)). Last, the inter-layer insulation film 6 is exposed by polishing and smoothing by a polishing process such as CMP, thereby to form copper plugs 11 as shown in FIG. 1(f). The under-layer copper interconnects 4 can also be formed by forming interconnect grooves in the inter-layer insulation film 2, forming the barrier film and the copper film and then polishing by CMP.

Such a process has also been proposed that is based on so-called dual damascene method where via holes and interconnect grooves are combined as shown in FIG. 2. Similarly to that of FIG. 1(a), the resist 7 is applied in a via hole pattern (FIG. 2(a)) thereby to form the via holes 8 similarly to the above (FIG. 2(b)). Then a resist mask pattern 7' is formed again for the purpose of forming grooves (FIG. 2(c)), and the resist is used as the mask for etching the inter-layer insulation film 6 to form the interconnect grooves 12 shown in FIG. 2(d). This is followed by the removal of the stopper film 5 similar to that shown in FIG. 1(c) (FIG. 2(e)), formation of the barrier film 9 (FIG. 2(f)), formation of the copper film 10 (FIG. 2(g)) and CMP polishing, thereby to make the dual damascene (DM) structure 13 as shown in FIG. 2(h).

For the etching of the silicon nitride film used as the etching stopper and the like, various methods have been proposed. In Japanese Unexamined Patent Publication No. Hei 8-97194, for example, a method of plasma etching using $CF_4$, $O_2$ and Ar is disclosed. In Japanese Unexamined Patent Publication No. Hei 10-303187, a method of applying the reactive ion etching (RIE) using a fluorocarbon gas selected from $CH_2F_2$, $CH_3F$ and $CHF_3$, and an inert gas such as Ar is disclosed, describing that particularly anisotrpic etching can be achieved with a high etch selectivity over the silicon oxide film and a high etching rate, by introducing the inert gas at a flow rate at least three times that of the fluorocarbon gas and setting the ambient gas pressure in a range from 1.33 to 67 Pa (10 to 500 mTorr), power density in a range from 1.1 to 5.5 W/cm$^2$ and substrate temperature in a range from 20 to 95° C. Japanese Unexamined Patent Publication No. Hei 11-186224 describes that use of a process gas containing a fluorocarbon gas that has hydrogen bond and CO gas makes it possible to carry out etching of the silicon nitride film with high etch selectivity over silicon oxide film and, particularly, achieve self-alignment etching for removing a silicon nitride film that has a stepped structure.

These examples teach the methods of etching an ordinary silicon nitride film, but do not suggest as to a semiconductor device that has copper interconnects formed below thereof.

In Japanese Unexamined Patent Publication No. Hei 11-220021, such a method is described as copper provided in an under layer is prevented from being sputtered when tapered walls of upper portions of holes are formed, thereby preventing the copper from depositing on the wall surface of the hole and diffusing into the insulation film, by etching the upper portion of the hole to form a tapered surface after forming the insulation film with a silicon nitride film as an etching stopper film on copper interconnects and forming via holes in the insulation film, then etching the stopper film while introducing 15 sccm, 15 sccm and 400 sccm of $CF_4$, $CHF_3$ and Ar, respectively, into a plasma atmosphere with the substrate temperature being set to about 0° C. and the ambient etching gas pressure to about 67 Pa (500 mTorr). This publication also discloses another method of removing the resist and the stopper film at the same time by placing a semiconductor substrate in a chamber of plasma atmosphere that contains oxygen, after forming via holes in an insulation film. With this method, the silicon nitride film used as the stopper film is removed by physical etching by means of Ar that is introduced together with oxygen into the chamber. At this time, it is described, the copper interconnects located below the stopper film is oxidized by the oxygen introduced, and is therefore protected from the physical sputtering by Ar.

The present inventors have found that, when a silicon nitride film located on a copper interconnects is etched by using a fluorine gas, there is a possibility of precipitation of a large amount of copper fluoride, that is the reaction product of the exposed copper and the fluorine gas, at a time near the end of etching. The present inventors also have found it that the copper fluoride is not so good in electrical conductivity and should be removed because of the effect thereof in impeding the formation of the barrier film in a subsequent process, and that the use of a peeling solution known in the prior art in the removal causes the exposed copper interconnects to dissolve, thus leading to a serious problem.

Such precipitation of a significant amount of copper fluoride was observed also with the first method described in the Japanese Unexamined Patent Publication No. Hei 11-220021 mentioned above.

While the second method described in the above publication does not use a fluorine gas, such a problem of fluoride does not occur, but the method of physically removing the silicon nitride film by sputter etching has a low etching rate and cannot be regarded as a practical method. In order to increase the etching rate to a practical level, it is natural to increase the ion energy thereby to provide Ar ion stream of higher speed, although this results in higher rate of oxidizing copper, thus forming a thicker copper oxide layer. When the thicker copper oxide layer is removed, thickness of the copper interconnects decreases and the resistance of the wiring increases.

SUMMARY OF THE INVENTION

An object of the present invention is to provide an etching method that restrains the formation of copper fluorides when removing a stopper film, which comprises a silicon nitride film, formed on copper interconnects, by using a fluorine gas.

The present inventors have studied intensively to solve the problems described above and found that, when applying dry etching to the silicon nitride film formed on the copper interconnects by using a mixture of fluorocarbon gas and an inert gas as the reaction gas, formation of copper fluorides can be suppressed by containing a fluorocarbon gas having a carbon-hydrogen bond in the reaction gas thereby increasing the hydrogen content in the fluorocarbon gas, thus achieving the present invention.

The present invention relates to a method of etching a silicon nitride film, which comprises subjecting the silicon nitride film located on copper to dry etching using a mixture of fluorocarbon gas and an inert gas as the reaction gas, the fluorocarbon gas containing $CF_4$ and $CHF_3$ supplied at flow rates in a ratio of 3:7 to 0:1 or contains $CF_4$ and $CH_2F_2$ supplied at flow rates in a ratio of 2.5:1 to 0:1.

The present invention also relates to a method of producing a semiconductor device, which comprises the steps of forming a first insulation film consisting of a silicon nitride film located on copper interconnects that is formed on a semiconductor substrate; forming a second insulation film; that is different from the first insulation film, on the first insulation film; forming a resist mask pattern on the second insulation film; forming grooves or holes in the second insulation film via the resist mask pattern; removing the resist; removing the first insulation film exposed at the bottom of the grooves or the holes that are formed in the second insulation film; and forming metal films in the grooves or the holes, wherein the first insulation film is removed by dry etching by using a mixture of fluorocarbon gas and an inert gas as the reaction gas, with the fluorocarbon gas containing $CF_4$ and $CHF_3$ being supplied at flow rates in a ratio of 3:7 to 0:1 or containing $CF_4$ and $CH_2F_2$ supplied at flow rates in a ratio of 2.5:1 to 0:1.

According to the present invention, it is made possible to effectively suppress the formation of copper fluorides that is difficult to remove, by using a mixture of fluorocarbon gas that contains $CF_4$ and $CHF_3$ supplied at flow rates in a ratio of 3:7 to 0:1 or $CF_4$ and $CH_2F_2$ supplied at flow rates in a ratio of 2.5:1 to 0:1 when removing the silicon nitride film formed on the copper interconnects.

DETAILED DESCRIPTION OF THE PREFERRED EMBODIMENTS

The present invention will now be described in detail below.

Figure 3:
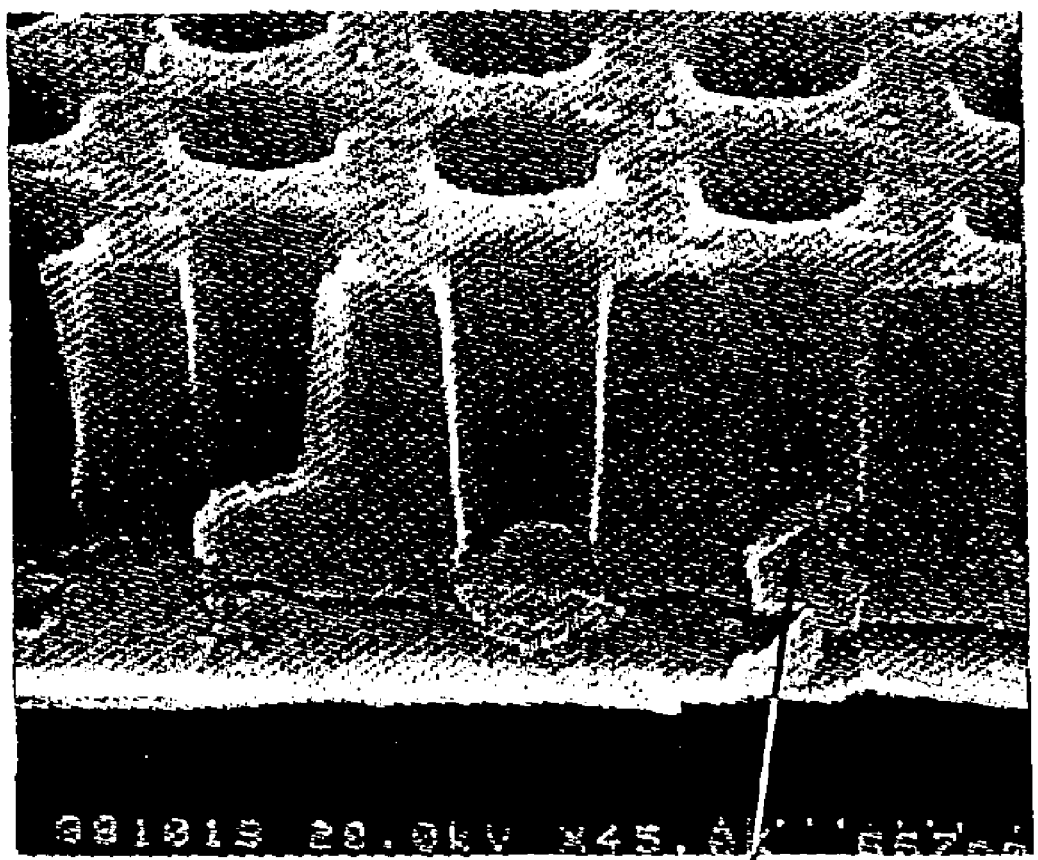
FIG. 3 is an electron microscope photograph showing a state of copper fluoride being formed, which is the subject of the present invention.

According to the research conducted by the present inventors, in the case of an etching process (Experiment 1 to be described later) using a mixture containing $CF_4$ and $CHF_3$ supplied at flow rates in a ratio of 7:3 as the fluorocarbon gas and Ar as the inert gas, formation of copper fluoride was observed conspicuously as shown in the electron microscope photograph of FIG. 3 and a large amount of copper fluoride was observed to be precipitated at the bottom of the via holes that have been formed. On the other hand, it was found that the formation of copper fluoride decreases when the proportion of the fluorocarbon gas, which has carbon-hydrogen bond, for example $CHF_3$, is increased.

First, the inventor used $CF_4$, $CHF_3$ and Ar as the reaction gas to see the change in the amount of copper fluoride being formed with changing proportion of $CF_4$ and $CHF_3$.

A substrate having SiN film formed to a thickness of 100 nm on a copper interconnects having thickness of 300 nm by plasma CVD process and an $SiO_2$ film formed to a thickness of 800 nm by plasma CVD process on the SiN film, was used as the sample in the experiment. After forming via holes of 0.3 μm in the $SiO_2$ film, the SiN film was etched while changing the composition of the reaction gas as shown in Table 1 under the conditions of substrate temperature, ambient gas pressure and ion energy shown in the Table. The results are shown in Table 1. It has been known in the prior art that, when a silicon insulating film is etched by using a fluorocarbon gas, a high-molecular deposit (hereinafter referred to as a "fluorocarbon deposit") containing carbon and fluorine is formed. This phenomenon was also studied in the experiment. Formation of the fluorocarbon deposit and the copper fluoride was examined by cutting the sample subjected to the experiment to reveal a vertical cross section of the via hole, and observing the section with an electron microscope.

TABLE 1

| Experiment No. | | 1 | 2 | 3 | 4 |
|---|---|---|---|---|---|
| Gas composition | $CF_4$ | 7 | 5 | 3 | 0 |
| (flow rate: sccm) | $CHF_3$ | 3 | 5 | 7 | 10 |
| | Ar | 200 | 200 | 200 | 200 |
| Substrate temperature | | 20° C. | | | |
| Ambient gas pressure | | 0.3–8.0 (10–60 mTorr) | | | |
| Ion energy | | 1000 V | | | |
| Fluorocarbon deposit (amount) | | Small←----------→large | | | |
| Copper fluoride (amount) | | large | large | small | very small |

In Experiments 1 and 2, a large amount of copper fluoride was formed thus making the subsequent formation of a barrier film difficult. In Experiment 3, significantly small amount of copper fluoride was formed and very small amount of copper fluoride was formed in Experiment 4.

In a similar experiment using a mixture gas of $CF_4$, $CHF_3$ and Ar, a result similar to that of Experiment 3 was observed when $CF_4$ and $CHF_3$ were supplied in a proportion of 2.5:1. This shows that the formation of copper fluoride depends on the proportion of fluorine and hydrogen contents in the fluorocarbon gas.

Meanwhile the fluorocarbon deposit increased when the proportion of $CHF_3$ was increased. The fluorocarbon deposit is far easy to remove than the copper fluoride, and can be removed with, for example, oxygen plasma. For example, the fluorocarbon deposit can be removed when exposed to an oxygen plasma atmosphere for a period of about 30 seconds to 2 minutes under conditions of oxygen flow rate of 1000 sccm, pressure of 4 Pa (30 mTorr) and substrate temperature 20° C. Also because the surface of the copper interconnects is oxidized at this time, the oxide is removed. The oxide may be removed, for example, by using organoamine remover or by exposing the surface to a reducing atmosphere.

It has been known that formation of fluorocarbon deposit can be suppressed by etching with a fluorocarbon gas containing a trace of oxygen added thereto, as described in Japanese Unexamined Patent Publication No. Hei 5-109702. This leads to such a problem, however, that the copper interconnects located below is oxidized when oxygen is added to the etching gas.

As have been mentioned in conjunction with the second method disclosed in Japanese Unexamined Patent Publication No. Hei 11-220021, copper oxide film is insulating in nature and must be removed, although the problem of increasing resistance of the interconnects may be encountered depending on the thickness of the oxide film. However, since this method is very effective in suppressing the formation of fluorocarbon deposit, the present inventor studied to suppress the oxidization of the copper wiring while employing this method.

Through the study, it was found that oxidation of the copper interconnects could be suppressed by decreasing the ion energy during etching. Particularly, when the ion energy is kept within 1000 V, formation of the oxide film can be restrained within a tolerable range. This effect will be described below in conjunction with the experiment conducted.

Figure 4:
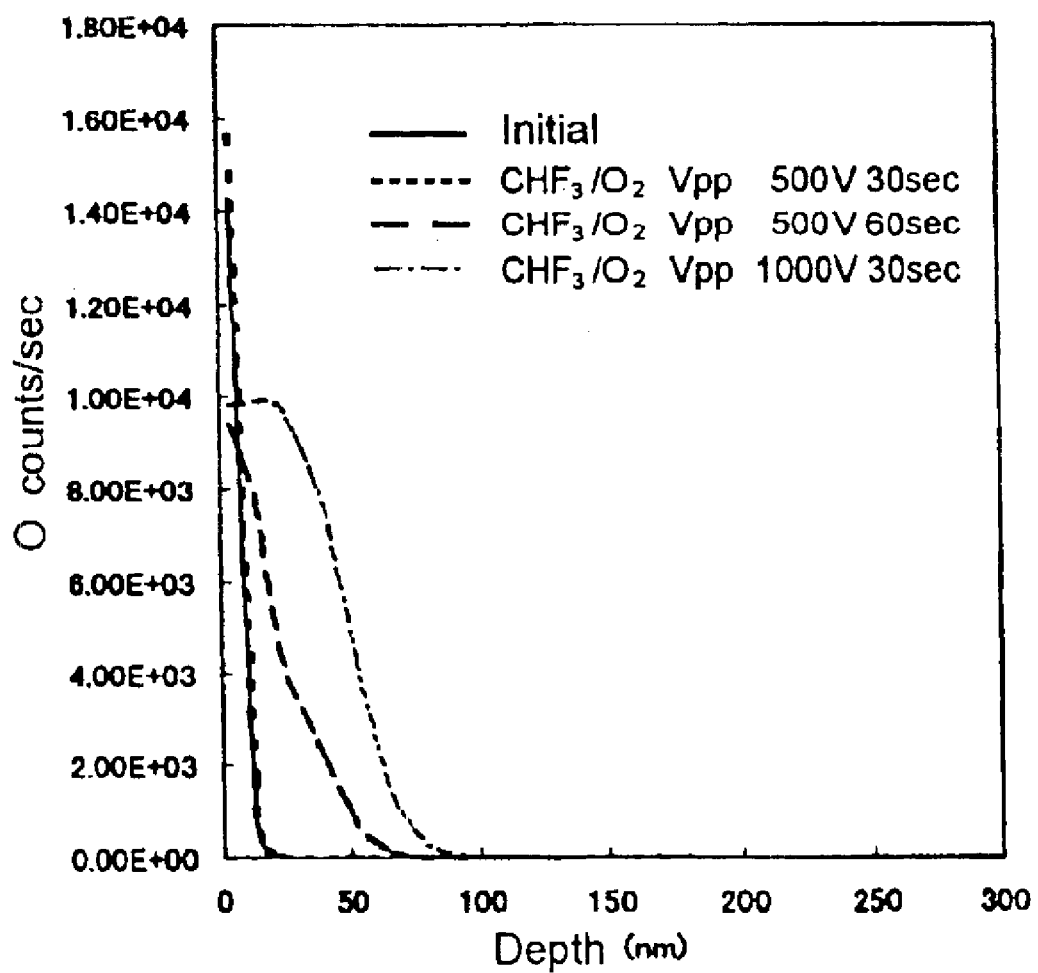
FIG. 4 is a graph obtained by SIMS showing the thickness of copper oxide film formed with different ion energies.

Samples used in the experiment were prepared by forming a thermal oxidation film on a silicon wafer and, after forming a barrier film thereon, forming a copper film by electroplating without forming a nitride film. The samples were exposed to a plasma atmosphere under conditions of flow rate of 25 sccm for $CHF_3$, 10 to 20 sccm for $O_2$ and 200 sccm for Ar, pressure of 1.3 to 8.0 Pa (10 to 60 mTorr) and substrate temperature of 20° C., while changing the ionization energy and processing time as (1) 500 V for 30 seconds, (2) 500 V for 60 seconds and (3) 1000 V for 30 seconds, and measuring the thickness of the oxide film formed on the copper film by SIMS. The results are shown in FIG. 4. In this graph, the initial values are those measured before the process, in the state of an oxidation film being formed to a thickness of about 20 nm on the surface by natural oxidation. Result obtained under the condition (1) is substantially similar to this initial state, and shows no significant oxidation having occurred. As the processing time becomes longer, oxidation proceeds while increasing the ion energy results in increasing thickness of the oxidation film. According to the present inventors' study, it has been confirmed that the oxide film about 80 nm thick formed under the condition (3) is within the tolerance for a copper wiring about 300 nm thick. When the oxide film grows further, say 100 nm or thicker, resistance of the wiring becomes a major problem.

Then in accordance to the result of evaluation described above, actual etching process was carried out on samples similar to those used in the evaluation as shown in Table 1, with the gas composition modified as shown in Table 2.

TABLE 2

| Experiment No. | 5 | | 6 | | 7 | |
|---|---|---|---|---|---|---|
| Gas composition (flow rate, sccm) | $CHF_3$ | 25 | $CH_2F_2$ | 25 | $CF_4$ | 25 |
| | $O_2$ | 10–20 | $O_2$ | 10–20 | $CH_2F_2$ | 10 |
| | Ar | 200 | Ar | 200 | $O_2$ | 3 |
| | | | | | Ar | 200 |
| Substrate temperature | 20° C. | | | | | |
| Ambient gas pressure | 1.3–8.0 Pa (10–60 mTorr) | | | | | |
| Ion energy | <1000 V | | | | | |
| Fluorocarbon deposit (amount) | very small | | very small | | very small | |
| Copper fluoride (amount) | very small | | very small | | small | |
| Copper oxide film | <80 nm | | <80 nm | | <80 nm | |

As shown in Table 2, very small amount of fluorocarbon deposit and small amount of copper fluoride formation were observed in any of the sets of compositions. Thickness of the copper oxide film was less than 80 nm in all cases, showing that the formation of copper oxide film was effectively suppressed.

The remaining deposit may be removed by oxygen plasma similarly to the case described above.

The copper oxide film that has been formed can be removed by a method known in the prior art, for example, by placing the processed substrate in a reducing atmosphere, or alternatively, by using an organoamine remover or the like.

The method of etching a silicon nitride film according to the present invention uses a fluorocarbon gas and an inert gas as the reaction gas, while the fluorocarbon gas contains $CF_4$ and $CHF_3$ being supplied at flow rates in a ratio of 3:7 to 0:1 or $CF_4$ and $CH_2F_2$ supplied at flow rates in a ratio of 2.5:1 to 0:1. While flow rate of introducing the fluorocarbon gas depends on the ambient gas pressure, substrate temperature and other etching conditions, total flow rate of 5 to 50 sccm into the etching chamber may be appropriate.

For the inert gas, He, Ar and the like may be used, while Ar is preferable. The inert gas may be supplied at a flow rate at least three times, preferably ten times or higher than that of the fluorocarbon gas.

Pressure of the etching atmosphere may be set in a range from 0.7 to 14 Pa (5 to 100 mTorr).

When the substrate temperature is higher than 150° C., copper is subjected to substantial oxidation and therefore the temperature should be kept lower, normally in a range from 0 to 60° C., and preferably in a range from about 0 to 30° C.

The following Examples further illustrate the present invention in detail, but it should be understood that the invention is not limited to these Examples.

EXAMPLE 1

Figure 1:
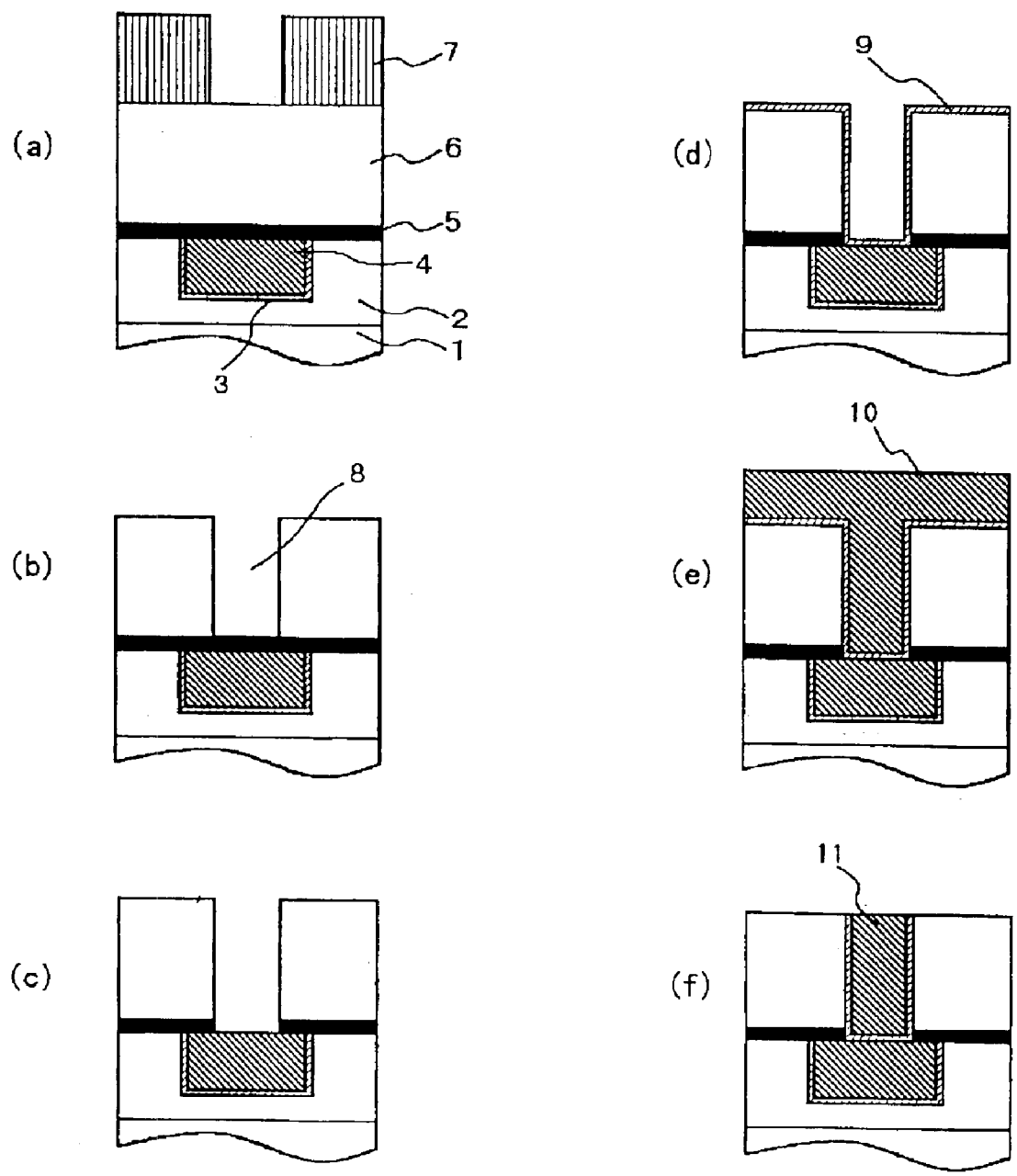
FIG. 1 is a sectional view showing the process of forming copper interconnects by single damascene method of the present invention and the prior art.

With reference to the drawing, description will now be made. FIG. 1 is a sectional view showing a process of the so-called single damascene forming method wherein copper is embedded in via holes formed in an inter-layer insulation film. First, as shown in FIG. 1(a), after forming functional elements such as transistors, that are not shown in the drawing, on a semiconductor substrate 1 such as silicon, a silicon oxide film is formed as an inter-layer insulation film 2. After forming interconnect grooves in the inter-layer insulation film 2, a barrier film 3 and a copper film are deposited therein and the surface is smoothed by the CMP polishing process, thereby forming an under-layer copper wiring 4 as a first wiring layer having thickness of 300 nm. A silicon nitride film that serves as an etching stopper film 5 having a thickness of 100 nm is formed on the under-layer copper interconnects 4 by the plasma CVD process, and a silicon nitride film having a thickness of 800 nm is formed thereon as an inter-layer insulation film 6 by the plasma CVD process. The silicon nitride film also functions to prevent the copper interconnects from being oxidized when forming the silicon oxide film thereon. Then the structure shown in FIG. 1(a) is obtained by patterning the resist 7 for the purpose of forming via holes in the inter-layer insulation film 6 where copper is to be inlaid.

Then as shown in FIG. 1(b), the inter-layer insulation film 6 is etched using the resist pattern as the mask. This is a reactive ion etching process carried out under dry etching condition using a mixture of $C_4F_8/CO/Ar$ as the reaction gas, followed by $O_2$ plasma processing at a temperature of 200° C., to remove the resist. Thus via holes 8 as shown in FIG. 1(b) are obtained.

Then as shown in FIG. 1(c), in order to facilitate contact between the inlaid copper and the under-layer copper interconnects 4, the stopper film 6 exposed at the bottom of the via hole 8 is removed under the conditions of experiment 3. This resulted in the deposition of fluorocarbon, but copper fluoride was hardly observed. Then the samples were processed in an oxygen plasma atmosphere for about 30 seconds under conditions of oxygen flow rate of 1000 sccm, pressure of 4 Pa (30 mTorr) and substrate temperature of 20° C., followed by the removal of the deposition using AP-970, an amine-base remover manufactured by Ashland Chemical Inc.

Then a barrier film 9 having TiN/Ti laminated structure was formed to a thickness of about 10 nm as shown in FIG. 1(d), followed by the formation of a thin copper film, that served as a seed, by CVD process or electroless plating process, that was further subjected to electroplating process to form a thick copper film 10 having a thickness of about 1 μm (FIG. 1(e)). Last, the surface was polished and smoothed by a polishing process such as CMP until the inter-layer insulation film 6 was exposed, thereby to form copper plugs 11 as shown in FIG. 1(f).

EXAMPLE 2

The copper plug was formed similarly to Example 1, except for modifying the conditions of removing the stopper film to contain oxygen of Experiment 5 and omitting the oxygen plasma processing after the etching. This resulted in less formation of copper fluoride and fluorocarbon deposit, showing that normal formation of the barrier film and embedding of the copper plugs are possible without applying the oxygen plasma processing.

Figure 2:
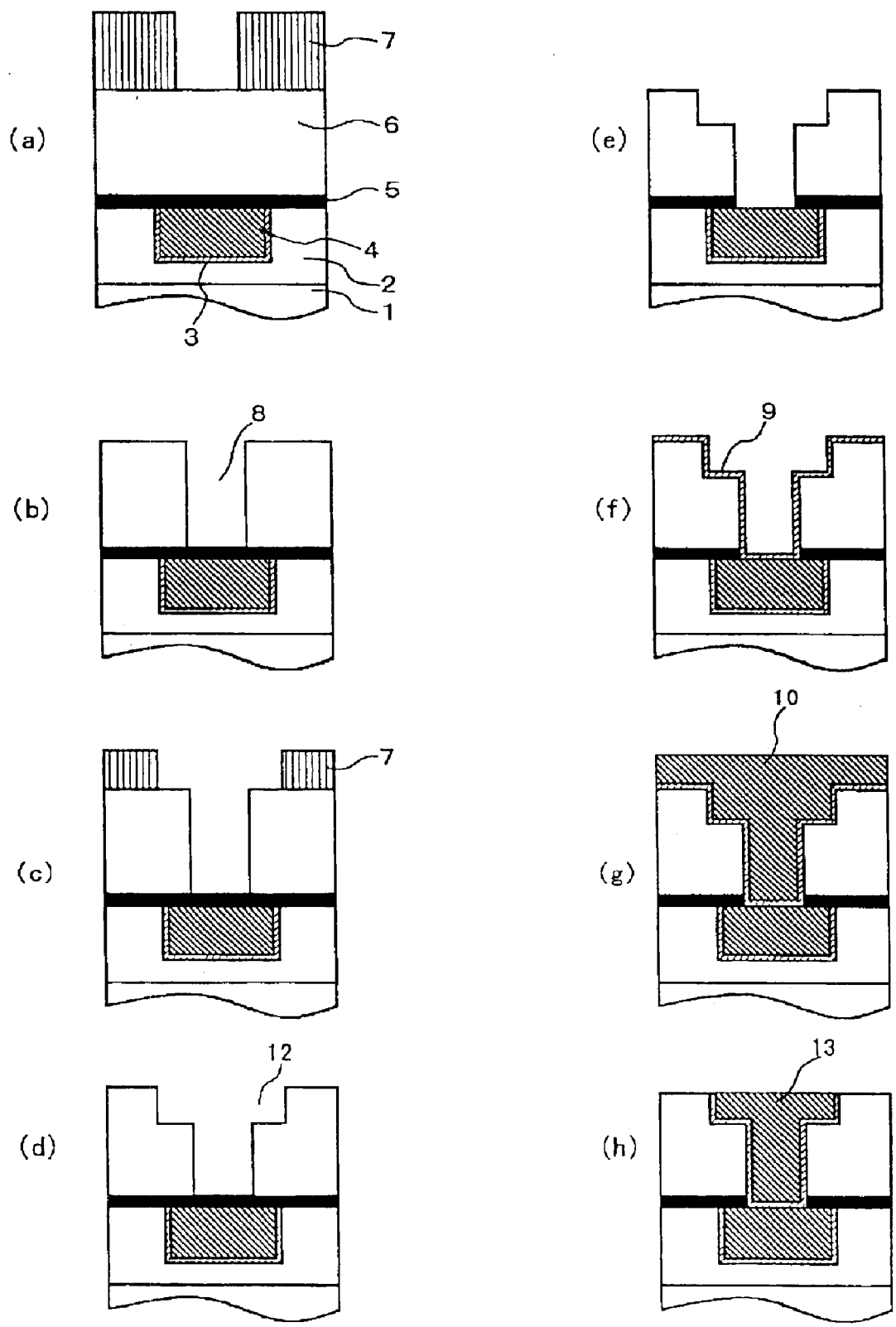
FIG. 2 is a sectional view showing the process of forming copper interconnects by dual damascene method of the present invention and the prior art.

Although the silicon oxide film ($SiO_2$) is used as the inter-layer insulation film formed on the semiconductor substrate and on the silicon nitride film in the cases described above, the present invention is not limited to this constitution and any material known in the prior art, that allows the use of silicon nitride film as the etching stopper film, may be used. For example, BPSG (phospho-boro silicate glass), PSG (phospho-silicate glass), BSG (borosilicate glass) and organic film having a low dielectric constant such as polyimide may be used. It is a matter of course that the present invention can be applied to the formation of copper interconnects by the dual damascene method shown in FIG. 2.

Although this specification focuses on the method of producing the wiring formed by inlaying copper by the damascene process, the metal film inlaid in the via holes or the grooves thus formed is not limited to copper, and the method of the present invention is applicable to a semiconductor device that employs a contact material known in the prior art.

What is claimed:

1. A method of etching a silicon nitride film, which comprises subjecting the silicon nitride film located on copper to dry etching using a mixture of fluorocarbon gas and an inert gas as the reaction gas, said fluorocarbon gas containing both $CF_4$ and $CH_2F_2$ supplied at flow rates in a ratio of 2.5:1 to suppress the formation of copper fluoride.

2. A method of etching a silicon nitride film according to claim 1, wherein said reaction gas contains oxygen and dry etching is carried out under the condition of ion energy of 1000 V or lower.

3. An etching method according to claim 1, wherein oxygen plasma processing is applied to after etching with said reaction gas.

4. A method of producing a semiconductor device, which comprises the steps of:

forming a first insulation film consisting of a silicon nitride film located on copper interconnects that is formed on a semiconductor substrate;

forming a second insulation film, that is different from said first insulation film, on said first insulation film;

forming a resist mask pattern on said second insulation film;

forming grooves or holes in said second insulation film via said resist mask pattern;

removing said resist;

removing said first insulation film exposed at the bottom of the grooves or the holes that are formed in said second insulation film; and forming a metal film in said grooves or the holes, wherein said first insulation film is removed by dry etching with a mixture of fluorocarbon gas and an inert gas used as the reaction gas, and said fluorocarbon gas contains both $CF_4$ and $CH_2F_2$ supplied at flow rates in a ratio of 2.5:1 to suppress the formation of copper fluoride.

5. A method of producing a semiconductor device according to claim 4, wherein said reaction gas contains oxygen and dry etching is carried out under the condition of ion energy of 1000 V or lower.

6. A method of producing a semiconductor device according to claim 4, wherein oxygen plasma processing is applied after etching with said reaction gas.

* * * * *